US009720292B2

(12) United States Patent
Wang et al.

(10) Patent No.: US 9,720,292 B2
(45) Date of Patent: Aug. 1, 2017

(54) LIQUID CRYSTAL DISPLAY PANEL AND METHOD FOR MAKING SAME

(71) Applicant: Century Technology (Shenzhen) Corporation Limited, Shenzhen (CN)

(72) Inventors: Ming-Tsung Wang, New Taipei (TW); Kuo-Chieh Chi, New Taipei (TW); Lin Li, Shenzhen (CN); Zhi-Wei Ye, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 24 days.

(21) Appl. No.: 14/935,683

(22) Filed: Nov. 9, 2015

(65) Prior Publication Data
US 2016/0291421 A1 Oct. 6, 2016

(30) Foreign Application Priority Data
Mar. 31, 2015 (CN) .......................... 2015 1 0147089

(51) Int. Cl.
| G02F 1/1333 | (2006.01) |
| G02F 1/1343 | (2006.01) |
| H01L 27/12 | (2006.01) |
| H01L 21/56 | (2006.01) |
| H01L 29/66 | (2006.01) |
(Continued)

(52) U.S. Cl.
CPC .... *G02F 1/134309* (2013.01); *G02F 1/13394* (2013.01); *G02F 1/13439* (2013.01); *G02F 1/133512* (2013.01); *G02F 1/136286* (2013.01); *H01L 21/563* (2013.01); *H01L 27/1259* (2013.01); *H01L 29/45* (2013.01); *H01L 29/66757* (2013.01); *H01L 29/66969* (2013.01); *G02F 2001/13398* (2013.01); *G02F 2001/136295* (2013.01)

(58) Field of Classification Search
CPC ................... G02F 2001/13398; G02F 1/13394
See application file for complete search history.

(56) References Cited

U.S. PATENT DOCUMENTS

| 8,558,976 B2 * | 10/2013 | Tsubata | .................. G02B 5/201 349/106 |
| 2006/0158499 A1 * | 7/2006 | Taguchi | .................. C09D 11/40 347/100 |

(Continued)

FOREIGN PATENT DOCUMENTS

| CN | 104122695 A | 10/2014 |
| CN | 104122722 A | 10/2014 |

*Primary Examiner* — Phu Vu
(74) *Attorney, Agent, or Firm* — Steven Reiss

(57) ABSTRACT

A liquid crystal display panel includes a thin film transistor substrate and an opposing substrate. The thin film transistor substrate includes a first base substrate, a common electrode formed on the first base substrate, a supporting structure formed on the first base substrate, and an electrical conduction structure formed on the supporting structure and electrically coupled to the common electrode. The opposing substrate includes a second base substrate and a blocking structure arranged on the second base substrate and made of electrical conducting material. The blocking structure is configured to be supported on and electrically coupled to the electrical conduction structure. A liquid crystal layer is formed between the thin film transistor substrate and the opposing substrate.

12 Claims, 16 Drawing Sheets

(51) Int. Cl.
*H01L 29/45* (2006.01)
*G02F 1/1335* (2006.01)
*G02F 1/1339* (2006.01)
*G02F 1/1362* (2006.01)

(56) References Cited

U.S. PATENT DOCUMENTS

2013/0148064 A1* 6/2013 Shih .................. B05D 5/06
349/123
2015/0021611 A1* 1/2015 Wang .................. G02F 1/1339
257/72

* cited by examiner

LIQUID CRYSTAL DISPLAY PANEL AND METHOD FOR MAKING SAME

CROSS-REFERENCE TO RELATED APPLICATIONS

This application claims priority to Chinese Patent Application No. 201510147089.9 filed on Mar. 31, 2015, the contents of which are incorporated by reference herein.

FIELD

The subject matter herein generally relates to liquid crystal display panels and a method for making the liquid crystal display panels.

BACKGROUND

Liquid crystal display panels that utilize thin film transistors generally require common electrodes in cooperation with pixel electrodes to control a liquid crystal layer of the liquid crystal display panel to display data.

BRIEF DESCRIPTION OF THE DRAWINGS

Implementations of the present technology will now be described, by way of example only, with reference to the attached figures.

DETAILED DESCRIPTION

Figure 1:
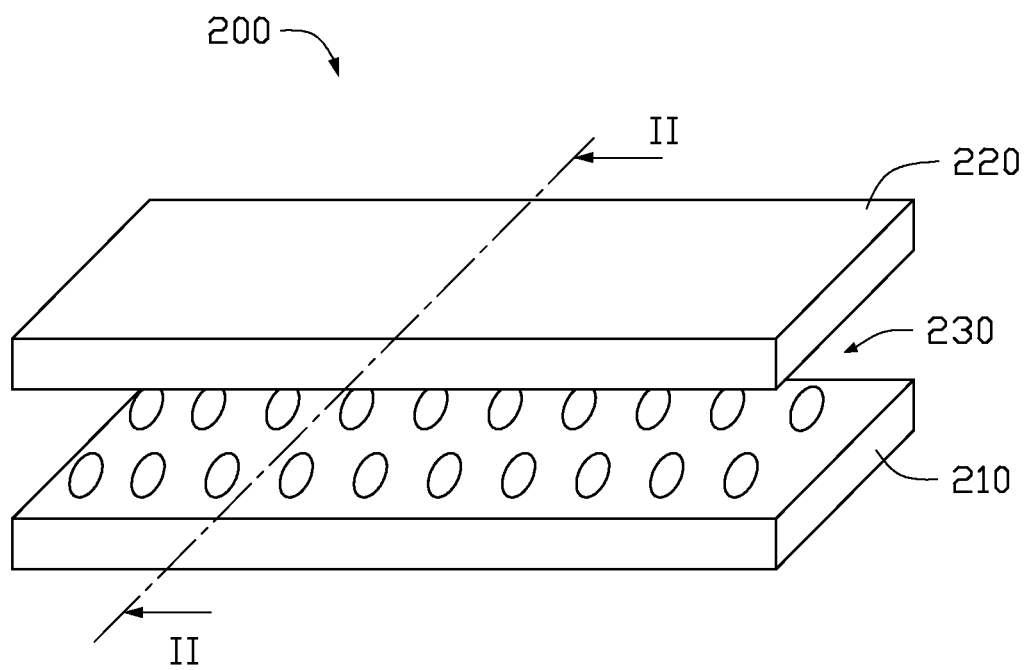
FIG. 1 is an isometric exploded view of an embodiment of a liquid crystal display panel.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIG. 1 illustrates an embodiment of a liquid crystal display 200 (hereinafter "the LCD 200"). The LCD 200 can include a thin film transistor substrate 210, an opposing substrate 220, and a liquid crystal layer 230. The liquid crystal layer 230 can be arranged between the thin film transistor substrate 210 and the opposing substrate 220. In at least one embodiment, the opposing substrate 220 is a color filter substrate.

Figure 2:
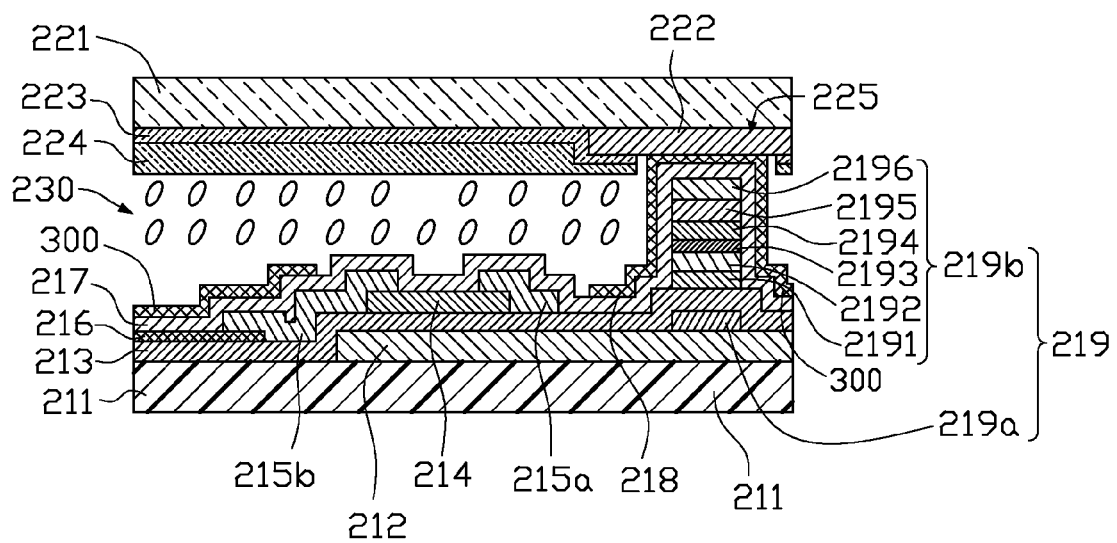
FIG. 2 is a cross-sectional view of FIG. 1 taken along line II-II.

As illustrated in FIG. 2, the thin film transistor substrate 210 can include a first base layer 211, a thin film transistor (not labeled), a pixel electrode 216, a passivation layer 217, an electrical conduction structure 218, a common electrode 300, and a supporting structure 219. The thin film transistor can include a first metal layer 212, an insulating layer 213, a channel layer 214, a source electrode 215a, and a drain electrode 215b. The first metal layer 212 can be formed on the first base layer 211. The insulating layer 213 can be formed on the first base layer 211 and be covered over the first metal layer 212. The channel layer 214 can be formed on the insulating layer 213 and face the first metal layer 212 across the insulating layer 213. The source electrode 215a and the drain electrode 215b can be formed on the insulating layer 213 and the channel layer 214 and be covered on opposite sides of the channel layer 214. The pixel electrode 216 can be formed on the insulating layer 213 and be partially covered by the drain electrode 215b. The pixel electrode 216 can be electrically coupled to the drain electrode 215b. The supporting structure 219 is used to fix a distance between the first supporting portion 219a and the second supporting portion 219b to receive the liquid crystal layer 230 in between. In at least one embodiment, the first supporting portion 219a is arranged on the first metal layer 212 and covered by the insulating layer 213. The second supporting portion 219b is arranged on the insulating layer 213 and faces the first supporting portion 219a across the insulating layer 213. The passivation layer 217 is covered over the pixel electrode 216, the source electrode 215a, the drain electrode 215b, the channel layer 214, and the second supporting portion 219b of the supporting structure 219. The common electrode 300 and the electrical conduction structure 218 are formed on the passivation layer 217. The electrical conduction structure 218 faces the supporting structure 219 across the passivation layer 217. The common electrode 300 and the pixel electrode 216 face each other. The common electrode 300 and the electrical conduction structure 218 are electrically coupled together.

In at least one embodiment, the first supporting portion 219a is made of a photoresist material. The second supporting portion 219b can include a first supporting layer 2191, a second supporting layer 2192, a third supporting layer 2193, a fourth supporting layer 2194, a fifth supporting layer 2195, and a sixth supporting layer 2196 arranged in sequence. The second supporting layer 2192, the fourth supporting layer 2194, and the sixth supporting layer 2196 can be made of a photoresist material. The first supporting layer 2191 and the channel layer 214 can be made of the same material. The third supporting layer 2193 and the channel layer 214 can be made of the same material. The fifth supporting layer 2195, the source electrode 215a, and the drain electrode 215b can be made of the same material.

The first base layer 211 can be made of glass, quartz, organic polymer, or other suitable transparent material. The first metal layer 212 can be made of metal or other electrical conducting material, such as metal alloy, metal oxide, metal nitride, metal nitrous oxide, or the like. The insulating layer 213 can be made of inorganic materials (silicon oxide, silicon nitride, silicon nitrous oxide, or the like), organic materials, or a combination thereof. The channel layer 214 and the third supporting layer 2193 can be made of non-crystalline silicon, polycrystalline silicon, oxidized semiconductor, or other suitable material. The pixel electrode 216 and the first supporting layer 2191 can be made of a transparent conducting material, such as indium tin oxide, indium zinc oxide, or the like. The source electrode 215a, the drain electrode 215b, and the fifth supporting layer 2195 can be made of metal or other electrical conducting material, such as metal alloy, metal oxide, metal nitride, metal nitrous oxide, or the like. The passivation layer 217 can be made of inorganic materials (silicon oxide, silicon nitride, silicon nitrous oxide, or the like), organic materials, or a combination thereof. The electrical conduction structure 218 and the common electrode 300 can be made of transparent conducting materials, such as indium tin oxide, indium zinc oxide, or the like. In other embodiments, one or more of the first supporting layer 2191, the second supporting layer 2192, the third supporting layer 2193, the fourth supporting layer 2194, the fifth supporting layer 2195, and the sixth supporting layer 2196 can be omitted according to actual needs.

The opposing substrate 220 can include a second base layer 221, a blocking structure 222, a color photoresist 223, and a planarization layer 224. The blocking structure 222 and the color photoresist 223 are formed in sequence on the second base layer 221. The color photoresist 223 is partially covered on opposite sides of the blocking structure 222. The planarization layer 224 is covered over the color photoresist 223. An opening 225 is defined between the opposite sides of the blocking structure 222 not covered by the color photoresist 223 and the planarization layer 224. The blocking structure 222 can overlap with scan lines (not shown) or data lines (not shown) of the liquid crystal display panel 200.

The electrical conduction structure 218 of the supporting structure 219 is received in the opening to support the blocking structure thereon.

In at least one embodiment, the second base layer 221 can be made of glass, quartz, organic polymer, or other suitable transparent material. The color photoresist 223 can include a red color photoresist, a green color photoresist, and a blue color photoresist. The blocking structure 222 can be made of metal or other electrical conducting materials, such as metal alloy, metal oxide, metal nitride, metal nitrous oxide, or the like. The planarization layer 224 can be made of inorganic materials (silicon oxide, silicon nitride, silicon nitrous oxide, or the like), organic materials, or a combination thereof.

FIGS. 3-15 illustrate a method for making the liquid crystal display 200.

Figure 3:
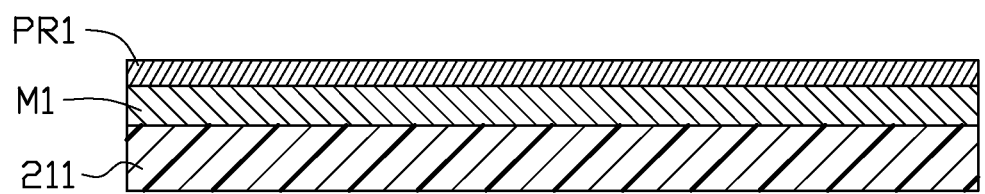
FIG. 3 is a cross-sectional view showing a first metal material layer and a first photoresist material layer formed on a first base layer.

As illustrated in FIG. 3, a first metal material layer M1 and a first photoresist material layer PR1 can be formed in sequence on the first base layer 211.

Figure 4:
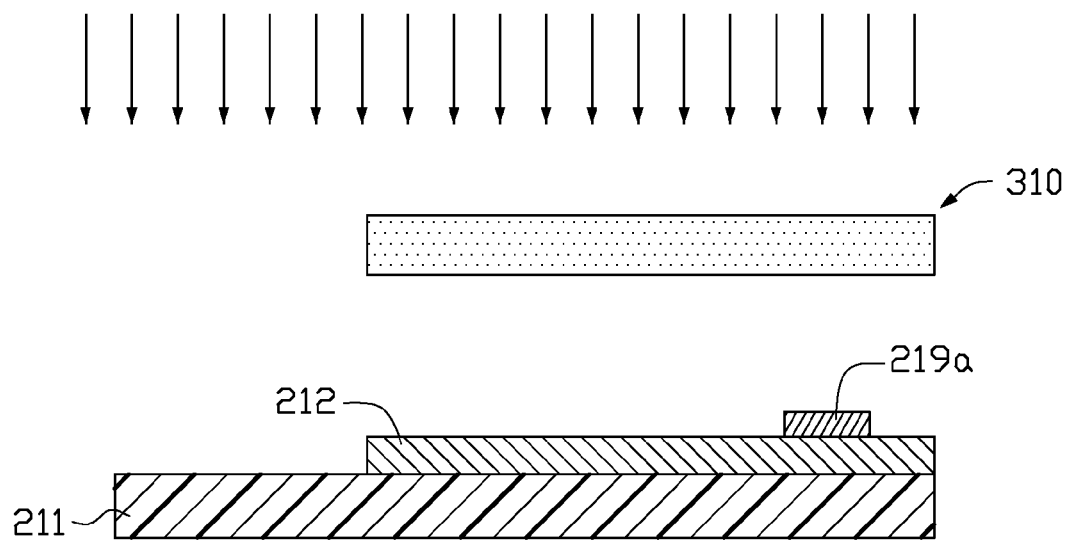
FIG. 4 is a cross-sectional view showing a first metal layer and a first supporting portion patterned from the first metal material layer and the first photoresist material layer.

As illustrated in FIG. 4, the first metal layer 212 and the first supporting portion 219a can be patterned from the first metal material layer M1 and the first photoresist material layer PR1, respectively by applying a first grayscale mask 310.

Figure 5:
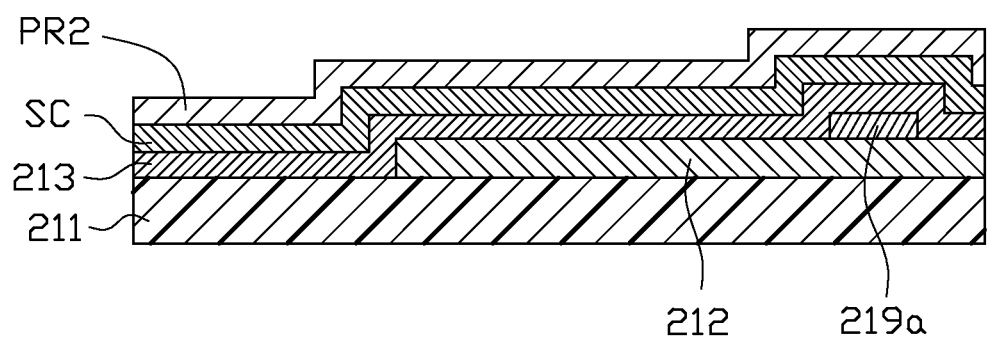
FIG. 5 is a cross-sectional view showing an insulating layer, a semiconducting layer, and a second photoresist material layer formed on the first base layer.

As illustrated in FIG. 5, the insulating layer 213 can be formed on the first base layer 211, the first metal layer 212, and the first supporting portion 219a. A semiconducting layer SC and a second photoresist material layer PR2 can be formed in sequence on the insulating layer 213.

Figure 6:
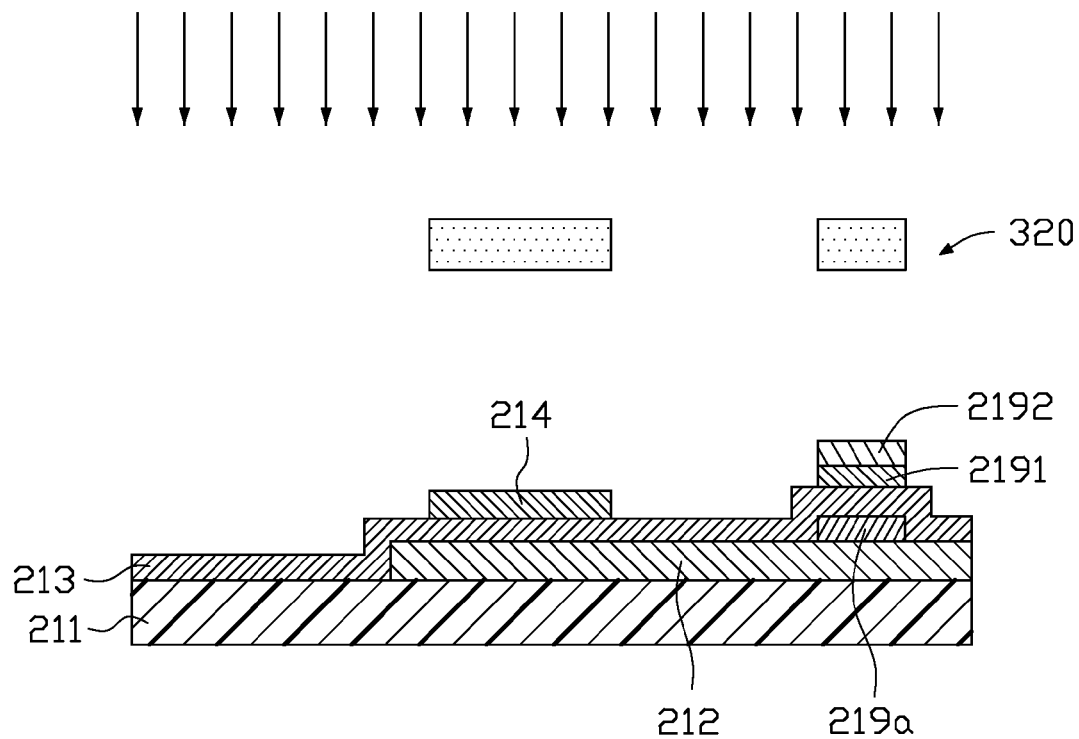
FIG. 6 is a cross-sectional view showing a channel layer and a first supporting layer patterned from the semiconducting layer and a second supporting layer patterned from the second photoresist material layer.

As illustrated in FIG. 6, the channel layer 214 and the first supporting layer 2191 can be patterned from the semiconducting layer SC, and the second supporting layer 2192 can be patterned from the second photoresist material layer PR2. The semiconducting layer SC and the second photoresist material layer PR2 can be patterned by applying a second grayscale mask 320.

Figure 7:
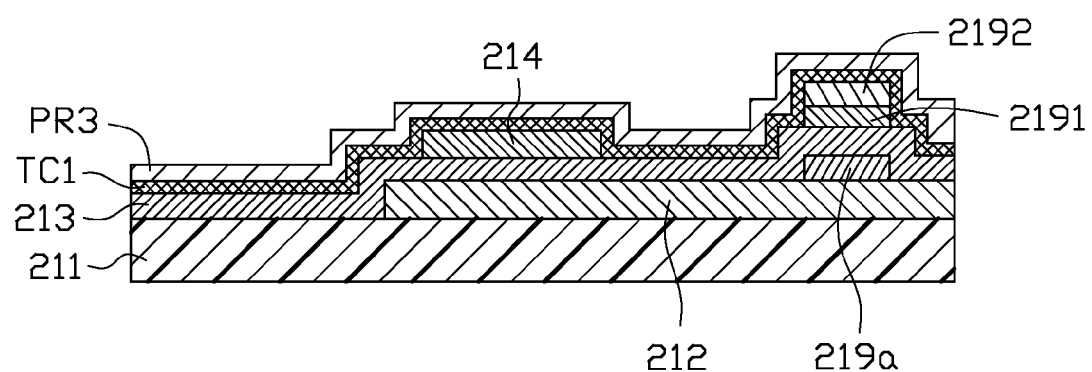
FIG. 7 is a cross-sectional view showing a first transparent conducting layer and a third photoresist material layer formed on the first base layer.

As illustrated in FIG. 7, a first transparent conducting layer TC1 can be formed on the insulating layer 213, the channel layer 214, and the second supporting layer 2192. A third photoresist material layer PR3 can be formed on the first transparent conducting layer TC1.

Figure 8:
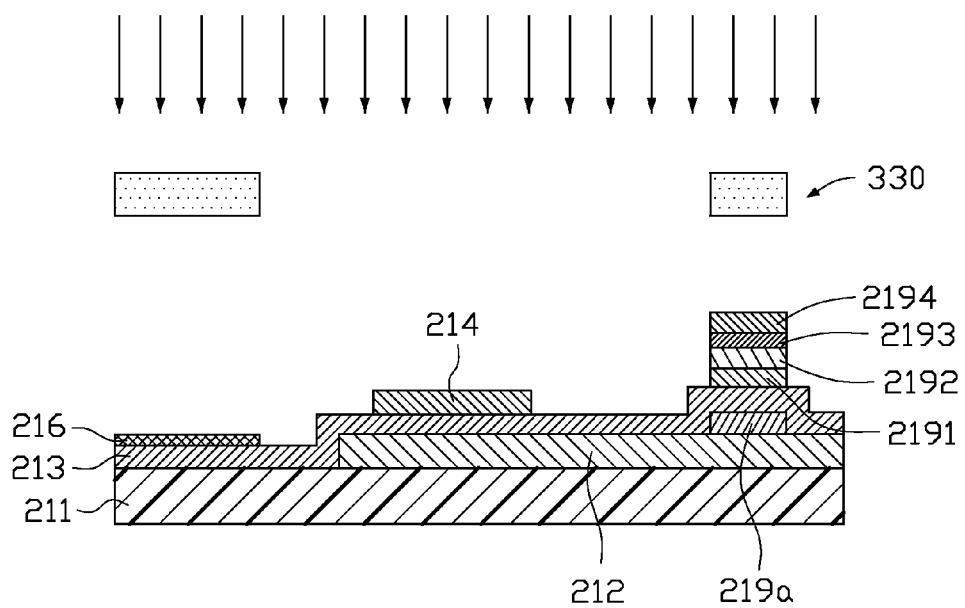
FIG. 8 is a cross-sectional view showing a pixel electrode and a third supporting layer patterned from the first transparent conducting layer and a fourth supporting layer patterned from the third photoresist material layer.

As illustrated in FIG. 8, the pixel electrode 216 and the third supporting layer 2193 can be patterned from the first transparent conducting layer TC1, and the fourth supporting layer 2194 can be patterned from the third photoresist material layer PR3. The first transparent conducting layer TC1 and the third photoresist material layer PR3 can be patterned by applying a third grayscale mask 330.

Figure 9:
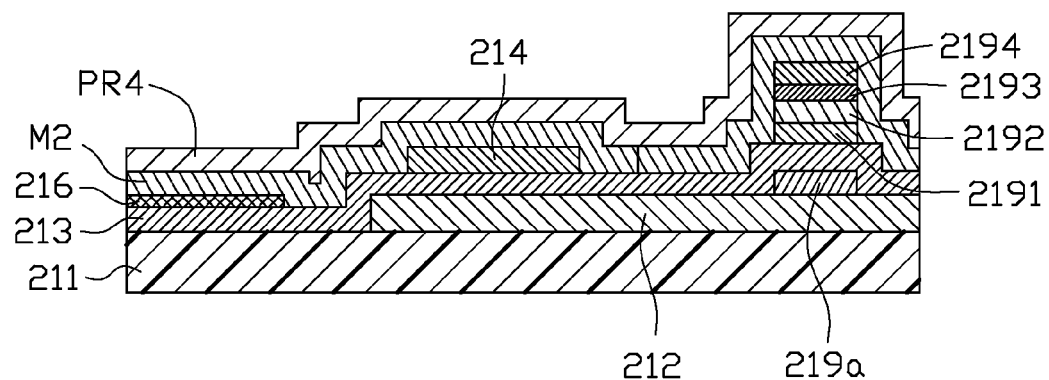
FIG. 9 is a cross-sectional view showing a second metal material layer and a fourth photoresist material layer formed on the first base substrate.

As illustrated in FIG. 9, a second metal material layer M2 can be formed on the insulating layer 213, the channel layer 214, the fourth supporting layer 2194, and the pixel electrode 216. A fourth photoresist material layer PR4 can be formed on the second metal material layer M2.

Figure 10:
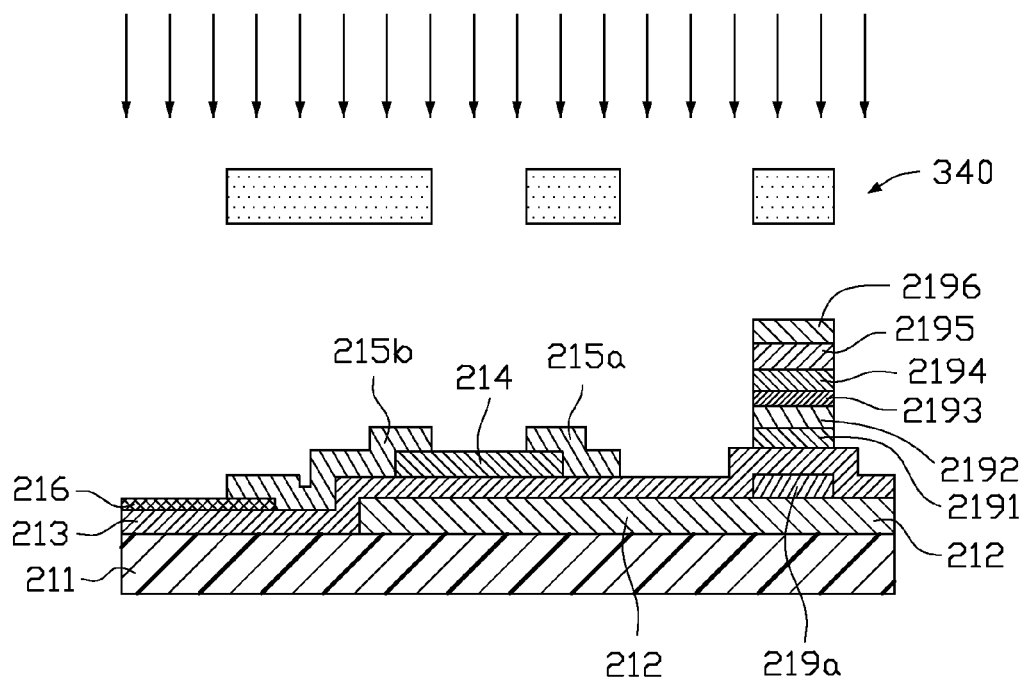
FIG. 10 is a cross-sectional view showing a source electrode, a drain electrode, and a fifth supporting layer patterned from the second metal material layer and a sixth supporting layer patterned from the fourth photoresist material layer.

As illustrated in FIG. 10, the source electrode 215a, the drain electrode 215b, and the fifth supporting layer 2195 can be patterned from the second metal material layer M2. The sixth supporting layer 2196 can be patterned from the fourth photoresist material layer PR4. The second metal material layer M2 and the fourth photoresist material layer PR4 can be patterned by applying a fourth grayscale mask 340.

Figure 11:
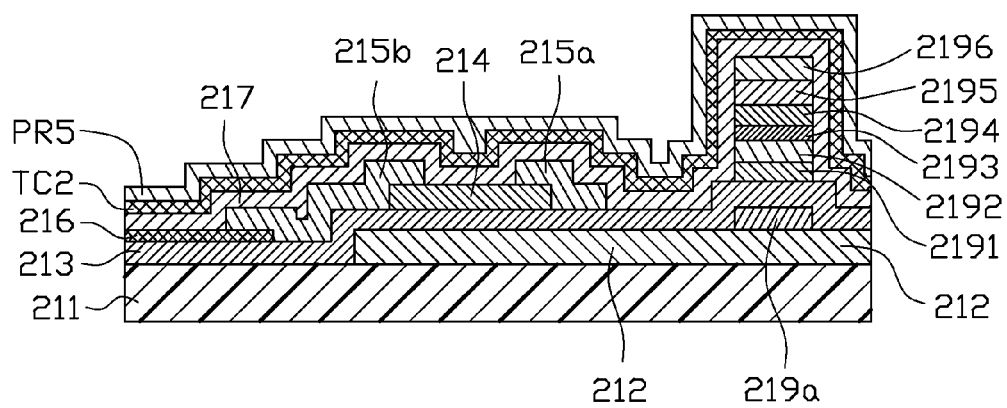
FIG. 11 is a cross-sectional view showing a passivation layer, a second transparent conducting layer, and a fifth photoresist material layer formed on the first base substrate.

As illustrated in FIG. 11, the passivation layer 218 can be formed on the insulating layer 213, the channel layer 214, the source electrode 215a, the drain electrode 215b, the pixel electrode 216, and the sixth supporting layer 2196. A second transparent conducting layer TC2 and a fifth photoresist material layer PR5 can be formed in sequence on the passivation layer 217.

Figure 12:
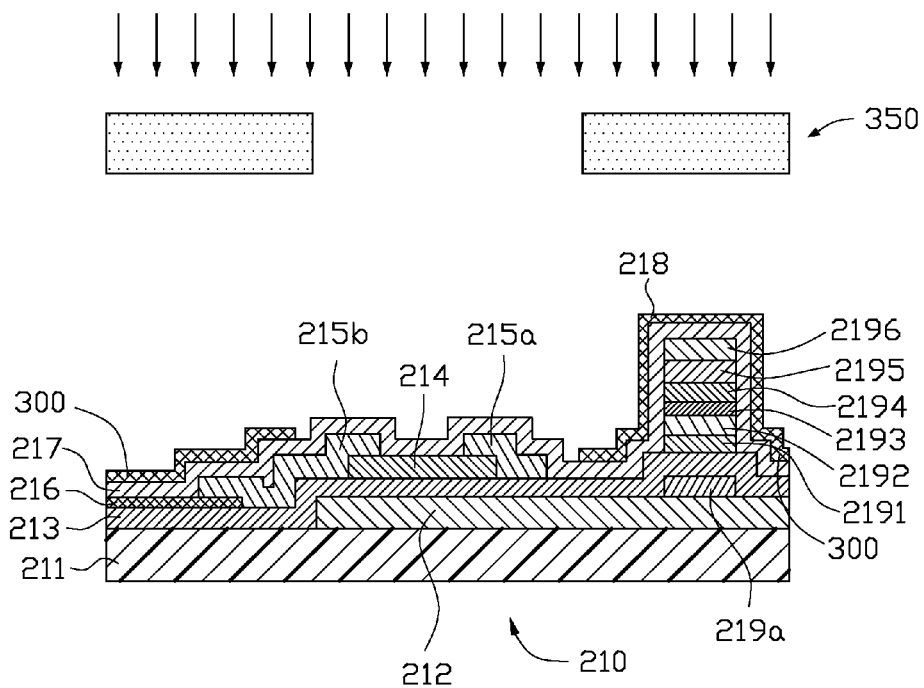
FIG. 12 is a cross-sectional view showing an electrical conduction structure and a common electrode patterned from the second transparent conducting layer and the fifth photoresist material layer removed.

As illustrated in FIG. 12, the electrical conduction structure 218 and the common electrode 300 can be patterned from the second transparent conducting layer TC2. After patterning the electrical conduction structure 218 and the common electrode 300, the fifth photoresist material layer PR5 can be removed. The second transparent conducting layer TC2 can be patterned by applying a fifth grayscale mask 350.

Figure 13:
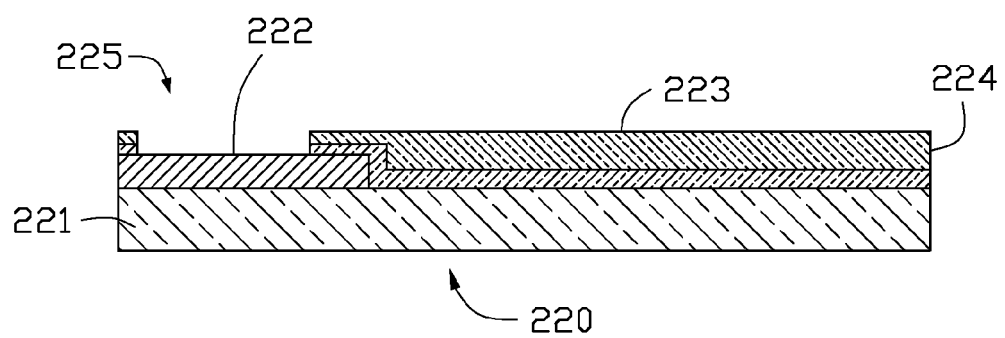
FIG. 13 is a cross-sectional view of an opposing substrate of the liquid crystal display panel.
Figure 14:
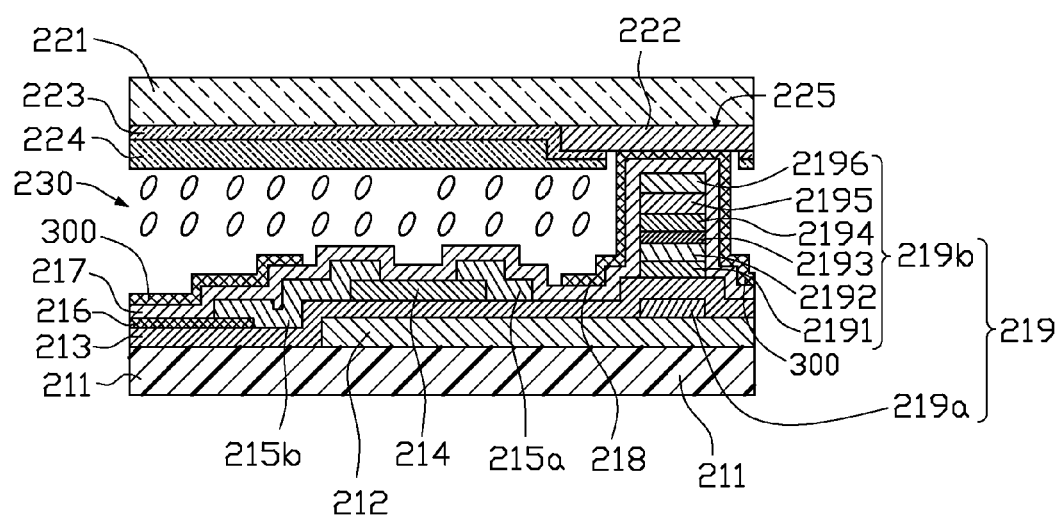
FIG. 14 is a cross-sectional view similar to FIG. 2.

As illustrated in FIG. 13 and FIG. 14, the opposing substrate 220 is supported by the supporting structure 219. The liquid crystal layer 230 is formed between the opposing substrate 220 and the passivation layer 217 to form the liquid crystal display 200.

Because the blocking structure 222 is made of metal, it is electrically coupled to the common electrode 300 through the electrical conduction structure 218. Thus, the blocking structure 222 can reduce a resistance of the common electrode 300. Additionally, because the supporting structure 219 is formed at the same time as other elements of the liquid crystal display 200, a required time for manufacturing the liquid crystal display 200 is reduced.

Figure 15:
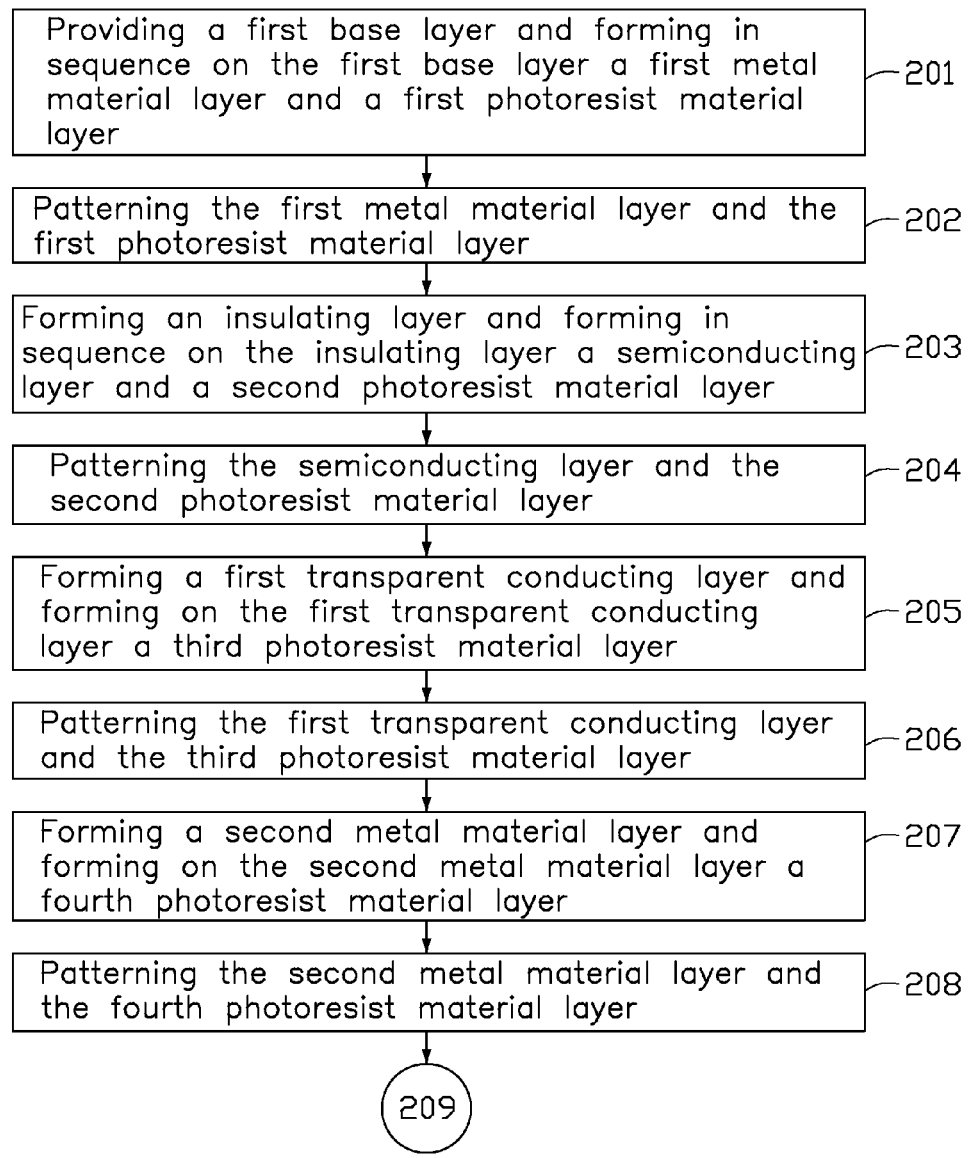
FIGS. 15 and 16 are a flowchart of an embodiment of a method of making the liquid crystal display panel.
Figure 16:
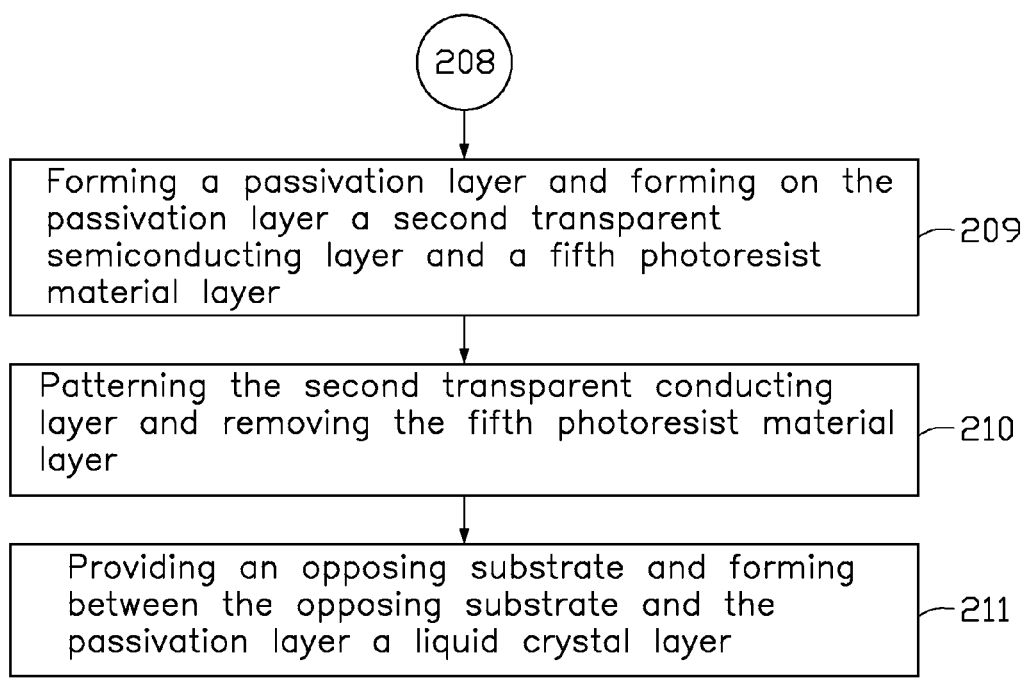

FIG. 15 and FIG. 16 illustrate a flowchart of an exemplary method for creating a liquid crystal display. The example method is provided by way of example, as there are a variety of ways to carry out the method. The method described below can be carried out using the configurations illustrated in FIGS. 1-14, for example, and various elements of these figures are referenced in explaining the example method. Each block shown in FIGS. 15-16 represents one or more processes, methods, or subroutines carried out in the example method. Furthermore, the illustrated order of blocks is by example only, and the order of the blocks can be changed. Additional blocks can be added or fewer blocks can be utilized, without departing from this disclosure. The example method can begin at block 201.

At block 201, a first base layer is provided, and a first metal material layer and a first photoresist material layer are formed in sequence on the first base layer. The first base layer can be made of glass, quartz, organic polymer, or other suitable transparent material. The first metal material layer can be made of metal or other electrical conducting material, such as metal alloy, metal oxide, metal nitride, metal nitrous oxide, or the like.

At block 202, the first metal material layer and the first photoresist material layer are patterned to form a first metal layer and a first supporting portion, respectively. The first metal material layer and the first photoresist material layer are patterned by applying a first grayscale mask. The first supporting portion is located on the first metal layer.

At block 203, an insulating layer can be formed on the first base layer, the first metal layer, and the first supporting portion. A semiconducting layer and a second photoresist material layer can be formed in sequence on the insulating layer. The insulating layer can be made of inorganic materials (silicon oxide, silicon nitride, silicon nitrous oxide, or the like), organic materials, or a combination thereof. The semiconducting layer can be made of non-crystalline silicon, polycrystalline silicon, oxidized semiconductor, or other suitable material.

At block 204, a channel layer and a first supporting layer can be patterned from the semiconducting layer, and a second supporting layer can be patterned from the second photoresist material layer. The semiconducting layer and the second photoresist material layer can be patterned by applying a second grayscale mask.

At block 205, a first transparent conducting layer can be formed on the insulating layer, the channel layer, and the second supporting layer. A third photoresist material layer can be formed on the first transparent conducting layer. The first transparent conducting layer can be made of a transparent conducting material, such as indium tin oxide, indium zinc oxide, or the like.

At block 206, a pixel electrode and a third supporting layer can be patterned from the first transparent conducting layer, and a fourth supporting layer can be patterned from the third photoresist material layer. The first transparent conducting layer and the third photoresist material layer can be patterned by applying a third grayscale mask. The pixel electrode and the channel layer are insulated from each other.

At block 207, a second metal material layer can be formed on the insulating layer, the channel layer, the fourth supporting layer, and the pixel electrode. A fourth photoresist material layer can be formed on the second metal material layer. The second metal material layer can be made of metal or other electrical conducting material, such as metal alloy, metal oxide, metal nitride, metal nitrous oxide, or the like.

At block 208, a source electrode, a drain electrode, and a fifth supporting layer can be patterned from the second metal material layer. A sixth supporting layer can be patterned from the fourth photoresist material layer. The second metal material layer and the fourth photoresist material layer can be patterned by applying a fourth grayscale mask. The source electrode and the drain electrode can be covered on opposite sides of the channel layer. The pixel electrode can be partially covered by the drain electrode and be electrically coupled to the drain electrode. The first supporting portion, the first supporting layer, the second supporting layer, the third supporting layer, the fourth supporting layer, the fifth supporting layer, and the sixth supporting layer can constitute a supporting structure.

At block 209, a passivation layer can be formed on the insulating layer, the channel layer, the source electrode, the drain electrode, the pixel electrode, and the sixth supporting layer. A second transparent conducting layer and a fifth photoresist material layer can be formed in sequence on the passivation layer. The passivation layer can be made of inorganic materials (silicon oxide, silicon nitride, silicon nitrous oxide, or the like), organic materials, or a combination thereof. The second transparent conducting layer can be made of transparent conducting materials, such as indium tin oxide, indium zinc oxide, or the like.

At block 210, an electrical conduction structure and a common electrode can be patterned from the second transparent conducting layer. After patterning the electrical conduction structure and the common electrode, the fifth photoresist material layer can be removed. The second transparent conducting layer can be patterned by applying a fifth grayscale mask.

At block 211, an opposing substrate is provided and supported by the supporting structure. A liquid crystal layer is formed between the second base substrate and the passivation layer. The opposing substrate can include a second base layer, a blocking structure, a color photoresist, and a planarization layer. The blocking structure and the color photoresist are formed in sequence on the second base layer. The color photoresist is partially covered on opposite sides of the blocking structure. The planarization layer is covered over the color photoresist. An opening 225 is defined between the opposite sides of the blocking structure 222 not covered by the color photoresist and the planarization layer. The electrical conduction structure of the supporting structure is received in the opening to support the blocking structure thereon. The electrical conduction structure is electrically coupled to the blocking structure.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method for making a substrate of a liquid crystal display panel, the method comprising:
   providing a first base substrate;
   forming a first metal layer on the first base substrate;
   forming a first supporting portion on the first metal layer;
   forming an insulating layer on the first base substrate the first metal layer, and the first supporting portion;
   forming a channel layer and a first supporting layer on the insulating layer;
   forming a second supporting layer on the first supporting layer;
   forming a pixel electrode on the insulating layer;
   forming a third supporting layer and a fourth supporting layer on the second supporting layer, the third supporting layer being arranged between the second supporting layer and the fourth supporting layer;
   forming a source electrode and a drain electrode on the insulating layer;
   forming a fifth supporting layer and a sixth supporting layer on the fourth supporting layer, the fifth supporting layer being arranged between the fourth supporting layer and the sixth supporting layer, the first through sixth supporting layers constituting a second supporting portion, and the first and second supporting portions constituting a supporting structure;
   forming a passivation layer on the pixel electrode, the drain electrode, the channel layer, the source electrode, the insulating layer, and the sixth supporting layer;
   forming a common electrode and an electrical connection structure on the passivation layer, the electrical connection structure being electrically coupled to the common electrode; and
   providing a second base substrate comprising a blocking structure made of electrical conducting material, the blocking structure supported on the electrical connection structure and electrically coupled to the electrical connection structure.

2. The method as in claim 1, wherein the first metal layer and the first supporting portion are formed by:
   depositing in sequence on the first base substrate a first metal material layer and a first photoresist material layer; and
   applying a first gray-scale mask on the first metal material layer and the first photoresist material layer to pattern the first metal layer from the first metal material layer and pattern the first supporting portion from the first photoresist material layer.

3. The method as in claim 2, wherein the channel layer, the first supporting layer, and the second supporting layer are formed by:
   depositing in sequence on the insulating layer a semiconducting layer and a second photoresist material layer; and
   applying a second gray-scale mask on the semiconducting layer and the second photoresist material layer to pattern the channel layer and the first supporting layer from the semiconducting layer and pattern the second supporting layer from the second photoresist material layer.

4. The method as in claim 3, wherein the pixel electrode, the third supporting layer, and the fourth supporting layer are made by:
   depositing on the insulating layer, the channel layer, and the second supporting layer a first transparent conducting layer and depositing on the first transparent conducting layer a third photoresist material layer; and
   applying a third gray-scale mask on the first transparent conducting layer and the third photoresist material layer to pattern the pixel electrode and the third supporting layer from the transparent conducting layer and pattern the fourth supporting layer from the third photoresist material layer.

5. The method as in claim 4, wherein the source electrode, the drain electrode, the fifth supporting layer, and the sixth supporting layer are made by:
   depositing a second metal material layer on the insulating layer, the channel layer, the fourth supporting layer, and the pixel electrode and depositing a fourth photoresist material layer on the second metal layer; and
   applying a fourth gray-scale mask on the second metal material layer and the fourth photoresist material layer to pattern the source electrode, the drain electrode, and the fifth supporting layer from the second metal material layer and pattern the sixth supporting layer from the fourth photoresist material layer.

6. A liquid crystal display panel comprising:
   a thin film transistor substrate comprising:
      a first base substrate;
      a common electrode formed on the first base substrate;
      a supporting structure formed on the first base substrate; and
      an electrical conduction structure formed on the supporting structure and electrically coupled to the common electrode;
   an opposing substrate comprising:
      a second base substrate; and
      a blocking structure arranged on the second base substrate and made of electrical conducting material, the blocking structure configured to be supported on and electrically coupled to the electrical conduction structure; and
   a liquid crystal layer formed between the thin film transistor substrate and the opposing substrate.

7. The liquid crystal display panel as in claim 6, wherein:
   the opposing substrate comprises a color photoresist and a planarization layer;
   the blocking structure and the color photoresist are formed in sequence on the second base substrate;
   the color photoresist and the planarization layer partially cover opposite sides of the blocking structure;
   the planarization layer is covered over the color photoresist;
   an opening is defined between the opposite sides of the blocking structure not covered by the color photoresist and the planarization layer; and
   the electrical conduction structure of the supporting structure is received in the opening to support the blocking structure thereon.

8. The liquid crystal display panel as in claim 6, wherein:
the thin film transistor substrate comprises a first metal layer, an insulating layer, a channel layer, a source electrode, a drain electrode, a pixel electrode, and a passivation layer;
the passivation layer is formed on the first metal layer, the insulating layer, the channel layer, the source electrode, the drain electrode, the pixel electrode, and the supporting structure;
the electrical conduction structure and the common electrode are formed on the passivation layer; and
the electrical conduction structure faces the supporting structure across the passivation layer.

9. The liquid crystal display panel as in claim 8, wherein:
the first metal layer is formed on the first base substrate;
the insulating layer is formed on the first base substrate and is covered over the first metal layer;
the channel layer is formed on the insulating layer and faces the first metal layer across the insulating layer;
the source electrode and the drain electrode are formed on the insulating layer and the channel layer and arranged at opposite sides of the channel layer;
the pixel electrode is formed on the insulating layer;
the pixel electrode is partially covered by the drain electrode and electrically coupled to the drain electrode; and
the passivation layer is covered over the pixel electrode, the source electrode, the drain electrode, and the channel layer.

10. The liquid crystal display panel as in claim 9, wherein:
the supporting structure comprises a first supporting portion and a second supporting portion;
the first supporting portion is arranged on the first metal layer and is covered by the insulating layer;
the second supporting portion is arranged on the insulating layer and is covered by the passivation layer; and
the second supporting portion faces the first supporting portion across the insulating layer.

11. The liquid crystal display panel as in claim 10, wherein:
the second supporting portion comprises a first supporting layer, a second supporting layer, a third supporting layer, a fourth supporting layer, a fifth supporting layer, and a sixth supporting layer arranged in sequence; and
the first supporting portion, the second supporting layer, the fourth supporting layer, and the sixth supporting layer are made of photoresist material.

12. The liquid crystal display panel as in claim 11, wherein:
the first supporting layer and the pixel electrode are made of the same material;
the third supporting layer and the channel layer are made of the same material; and
the fifth supporting layer, the source electrode, and the drain electrode are made of the same material.

\* \* \* \* \*